United States Patent [19]

Evans et al.

[11] Patent Number: 4,849,069

[45] Date of Patent: Jul. 18, 1989

[54] METHOD OF PRODUCING FILAMENTS

[75] Inventors: Alan G. R. Evans, Eastleigh; Mohammed M. Farooqui, Southampton, both of England

[73] Assignee: Spectrol Reliance Limited, Swindon, England

[21] Appl. No.: 131,059

[22] Filed: Dec. 9, 1987

[30] Foreign Application Priority Data

Dec. 13, 1986 [GB] United Kingdom ............... 8629817

[51] Int. Cl.⁴ ..................... H01L 21/306; C23F 1/02
[52] U.S. Cl. .................... 156/643; 156/653; 156/657; 437/228; 437/233
[58] Field of Search ............ 156/643, 646, 651, 652, 156/653, 657, 659.1, 662; 437/186, 228, 233, 234, 249, 927, 984

[56] References Cited

U.S. PATENT DOCUMENTS

| | | | |
|---|---|---|---|
| 4,358,340 | 11/1982 | Fu | 156/643 |
| 4,389,429 | 6/1983 | Soclof | 156/657 X |
| 4,442,589 | 4/1984 | Doo et al. | 156/643 X |
| 4,508,579 | 4/1985 | Goth et al. | 156/643 X |
| 4,648,937 | 3/1987 | Ogura et al. | 156/643 |

Primary Examiner—David L. Lacey
Assistant Examiner—Andrew J. Anderson

[57] ABSTRACT

A method of producing filaments of sub-micron cross-sectional dimensions including the steps of obtaining a substrate having a base and a delineating layer on the base and a step in a surface of the delineating layer, providing a layer of a material from which the filament is to be formed on the surface which replicates the step in the surface, anisotropically etching the layer of filament material in the direction of the surface so as to leave a filament of the material adjacent the step, and removing the delineating layer to wholly or partially separate the filament from the substrate.

22 Claims, 2 Drawing Sheets

METHOD OF PRODUCING FILAMENTS

The present invention relates to a method of producing filaments, and particularly filaments of submicron cross-sectional dimensions.

The present invention has as its object to provide a method of producing filaments of materials such as silicon, polysilicon, permalloy and the like of precisely defined configuration and of controlled dimensions and which can have sub-micron cross-sectional dimensions.

The present invention provides a method of producing filaments comprising the steps of:

(a) obtaining a substrate having a step in a surface thereof;

(b) providing a layer of a material from which the filament is to be formed on said surface which replicates the step in said surface; and (c) anisotropically removing said layer in the direction of said surface so as to leave a filament of said material adjacent said step.

The method may comprise the step of obtaining a substrate having a base and a delineating layer on said base in which said step is provided. Said delineating layer may be deposited or grown on said base e.g., may be grown thermally or be chemically isotropically deposited either with or without plasma activation. The delineating layer may be selectively deposited or grown so as to produce said step or said step may be formed by etching or erosion, e.g., selective etching, masked chemical etching, erosion by ion bombardment, plasma etching or reactive ion etching.

The layer from which the filament is to be formed may be removed by anisotropic etching, e.g., plasma etching at low pressure.

Material may be removed from said surface of said substrate, as by etching, to wholly or partially separate said filament from the substrate. Where the substrate comprises a delineating-layer as aforesaid, the delineating layer may be at least partially removed, as by etching, to wholly or partially separate the filament from the substrate. Material may be so removed from said surface of the substrate as to leave said filament connected to the substrate at one or more selected positions along the length of the filament, e.g., so as to leave the filament connected to the substrate at one or both ends. To this end, the material from which the substrate or said delineating layer of the substrate is formed may be etchable or removable differentially with respect to the material from which the filament is to be formed.

The substrate may be formed from silicon and/or silicon dioxide, e.g., may comprise a base of silicon and a delineating layer of silicon dioxide, and the material from which the filament is to be formed may be polysilicon.

The height of said step may be chosen according to the required thickness of the filament to be produced and the thickness of the layer from which the filament is to be formed may be chosen according to the required width of the filament to be produced.

The material of the filament may be treated, either before or after the filament has been produced, to impart required electrical and/or mechanical properties to the filament. For example the electrical conductivity of the filament may be adjusted to a required value by dopant diffusion, ion implantation and/or thermal treatment, either homogeneously or in one or more localized areas of the filament.

The invention will be more particularly described with reference to the accompanying diagrammatic drawings, in which.

Figure 1:
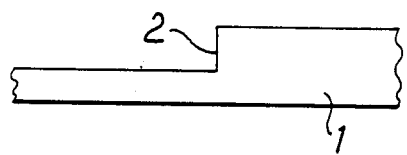
FIGS. 1 to 4 illustrate steps in the formation of a filament according to a first embodiment of the method of the present invention.
Figure 5:
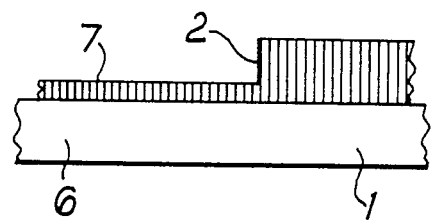
FIGS. 5 to 8 illustrate steps in the formation of a filament in accordance with the method according to a second embodiment of the present invention.
Figure 2:
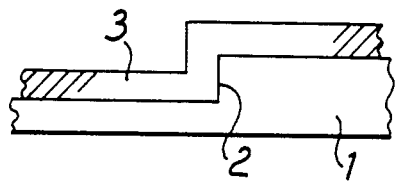
Figure 6:
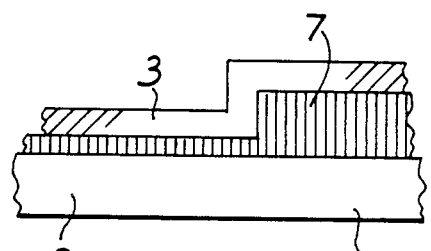
Figure 3:
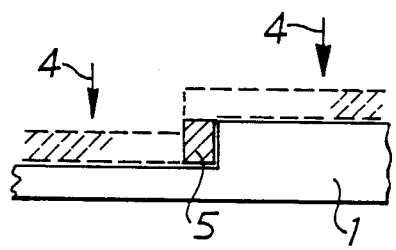
Figure 7:
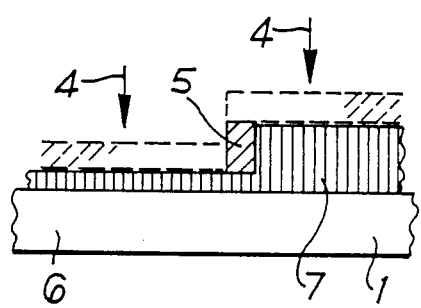
Figure 4:
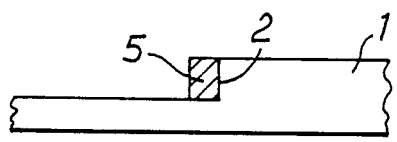
Figure 8:
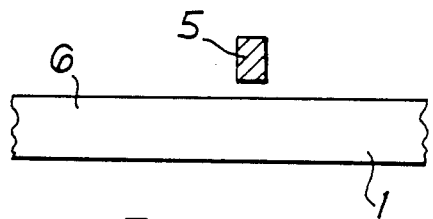

Referring to FIGS. 1 to 4 of the drawings, a substrate 1 of silicon or the like has a step 2 formed therein in any known or suitable manner, such as by selective etching, masked etching chemically, erosion by ion bombardment, plasma etching or reactive ion etching. A layer 3 of polysilicon or other material from which the filament is to be formed is then provided, e.g., deposited, on the substrate 1 so as to replicate the step 2 as shown in FIG. 2. Thereafter the layer 3 is etched anisotropically in the direction of the substrate 1 as indicated by the arrows 4 in FIG. 3 so as to remove the layer 3 and leave a filament 5 adjacent the step 2 as shown in FIG. 4. The height of the step 2 determines the thickness of the filament 5 while the thickness of the layer 3 determines the width of the filament 5 as will be apparent from a perusal of FIG. 3. The filament 5 can be left anchored to the substrate 1 as shown in FIG. 4 or may be wholly or partially separated from the substrate 1 by removing material from the substrate 1 as by selective etching.

Figure 9:
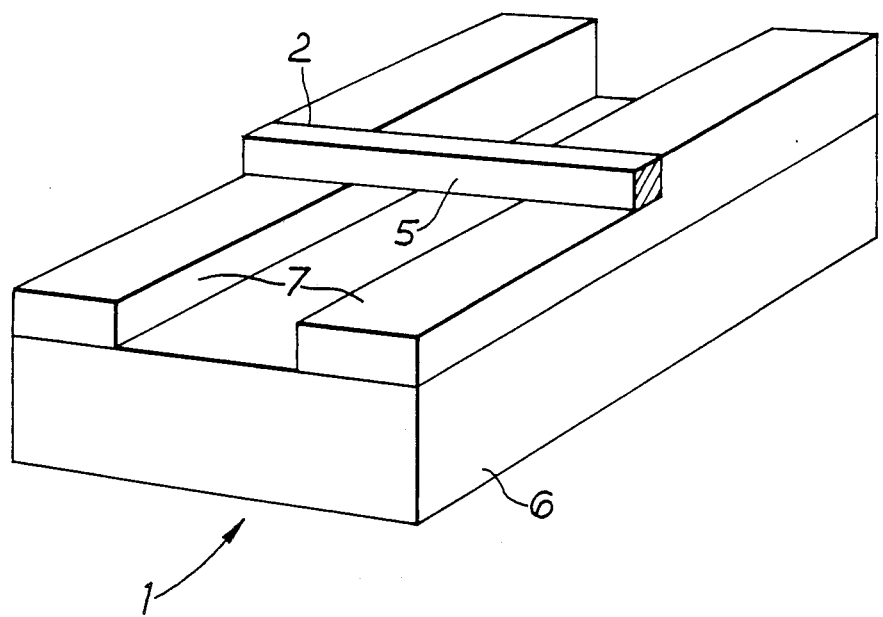
FIG. 9 illustrates a filament assembly produced by the method of the present invention.

The embodiment of FIGS. 5 to 8 is substantially the same as that of the embodiment of FIGS. 1 to 4 and accordingly like parts have been given like reference numerals. In the embodiment of FIGS. 5 to 8 the substrate 1 comprises a base 6 and a delineating layer 7, the step 2 being provided in the delineating layer 7 in any of the ways described hereinbefore or by selectively growing or depositing the material of the delineating layer 7 so as to define the step 2. The layer 3 from which the filament is to be formed is then provided, e.g., deposited, on the delineating layer 7 so as to replicate the step 2 and the layer 3 is then removed by anisotropic etching in the direction of the arrows 4 to leave the filament 5 adjacent the step 2. Thereafter the delineating layer 7 can be wholly or partially removed, e.g., in a second etch, to wholly or partially separate the filament 5 from the base 6 of the substrate 1. For example, as shown in FIG. 9, the delineating layer 7 may be partially removed so as to separate the medial portion of the filament 5 from the substrate 1 and leave the filament 5 supported at its opposite ends by the remainder of the delineating layer 7. The base 6 of the substrate 1 may be of silicon, the delineating layer 7 may be of silicon dioxide and the layer 3 from which the filament is to be formed may be of polysilicon.

The electrical conductivity of the filament 5 can be modified to desired values in known manner such as by dopant diffusion, ion implantation, or thermal treatment, either homogeneously or in localized areas. By control of the dopant concentration in desired areas, subsequent selective etching of the filament 5 can be carried out if desired.

EXAMPLE

1. A single crystal silicon slice, optically polished on one side was chemically cleaned and a layer of silicon nitride 500A thick was deposited by reacting silane with Ammonia in a LPCVD reactor.

2. The nitride layer was photo-patterned and etched for producing a number of ridges with vertical walls in a variety of configurations, according to the desired layout of the silicon fibers to be fabricated as described in this step below.

3. The exposed areas of the slice were then etched in a mixture of HF and $HNO_3$ to a depth of 1 μm isotropically.

4. The nitride layer was then stripped off chemically in hot phosphoric acid and, after rinsing and cleaning, the entire slice was oxidized in wet $0_2$ so that a layer of $SiO_2$ was formed 1 μm thick all over the slice.

5. Polysilicon was then deposited by decomposing silane in a LPCVD reactor at 630° C. to a thickness of 1 μm.

6. The slice was annealed at 950° C. in dry $N_2$ for 1 hour to relieve stress in the polysilicon film 7. The polysilicon was then anistropically etched in a gaseous plasma of $CHF_3$ excited by a RF field in a parallel reactor.

8. The etching reaction was stopped as soon as the polysilicon was etched fully on all the flat surfaces, as monitored optically by interference effects and color.

9. The slice was then etched in HF to remove all the oxide thus freeing the polysilicon filaments formed at the vertical edges of the oxide.

10. To produce filaments which had the desired resistivity and type, a masking operation was performed before etching the oxide as in step 9, and the filaments implanted with the desired dopant As, P or B required.

11. Polysilicon areas were masked with deposited $SiO_2$ to serve as connecting pads for the filaments, the $SiO_2$ preventing etching of the polysilicon during step 7. Selected areas were defined for implantation as described in step 10 above.

12. The dimensions of the filaments thus produced were slightly below 1 μm "diameter".

Filaments produced by the method of the present invention are suitable for use in fabricating thermal sensors conductivity sensors, IR and visible burnout proof emitters, segment displays, micro resonators, fiber optic waveguides, couplers, Hall sensors, magnetoresistive sensors, recording heads and other devices where the use of filaments of precisely defined configuration and of controlled dimensions is an advantage.

We claim:

1. A method of producing filaments comprising the steps of:
   (a) obtaining a substrate having a base and a delineating layer on said base and a step in a surface of the delineating layer;
   (b) providing a layer of a material from which the filament is to be formed on said surface which replicates the step in said surface;
   (c) anisotropically removing said layer of filament material in the direction of said surface so as to leave a filament of said material adjacent said step; and
   (d) removing said delineating layer to wholly or partially separate said filament from the substrate.

2. A method according to claim 1, wherein said delineating layer is deposited or grown on said base.

3. A method according to claim 2, wherein said delineating layer is grown thermally or is chemically isotropically deposited.

4. A method according to claim 3, wherein said delineating layer is selectively deposited or grown so as to produce said step.

5. A method according to claim 4, wherein the layer from which the filament is to be formed is removed by anisotropic etching.

6. A method according to claim 5, wherein said anisotropic etching comprises plasma etching.

7. A method according to claim 1, wherein said step is formed by etching or erosion.

8. A method according to claim 7, wherein said etching or erosion comprises selective etching, masked chemical etching, erosion by ion bombardment, plasma etching or reactive ion etching.

9. A method according to claim 1, wherein said delineating layer is so removed from said substrate as to leave said filament connected to the substrate at one or more selected positions along the length of the filament.

10. A method according to claim 9, wherein the filament is left connected to the substrate at one or both ends.

11. A method according to claim 10, wherein the delineating layer is formed from a material which is etchable or removable differentially with respect to the material from which the filament is to be formed.

12. A method according to claim 11, wherein the substrate is formed from silicon and silicon dioxide and the material from which said filament is to be formed is polysilicon.

13. A method according to claim 12, wherein the base of the substrate is of silicon and the delineating layer is of silicon dioxide.

14. A method according to claim 13, wherein the height of said step is chosen according to the required thickness of the filament to be produced.

15. A method according to claim 14, wherein the thickness of the layer from which the filament is to be formed is chosen according to the required width of the filament to be produced.

16. A method according to claim 15, which comprises treating the material of the filament to impart predetermined electrical or mechanical properties to the filament.

17. A method according to claim 16, wherein the electrical conductivity of the filament is adjusted to a predetermined value by dopant diffusion, ion implantation or thermal treatment.

18. A method according to claim 1, wherein the layer from which the filament is to be formed is removed by anisotropic etching.

19. A method according to claim 1, wherein the base of the substrate is of silicon, the delineating layer is of silicon dioxide and the material from which said filament is to be formed is polysilicon.

20. A method according to claim 1 wherein the height of said step is chosen according to the required thickness of the filament to be produced.

21. A method according to claim 1, wherein the thickness of the layer from which the filament is to be formed is chosen according to the required width of the filament to be produced.

22. A method according to claim 1, wherein the electrical conductivity of the filament is adjusted to a predetermined value by dopant diffusion, ion implantation or thermal treatment.

* * * * *